United States Patent
Wang et al.

(10) Patent No.: US 8,728,333 B2
(45) Date of Patent: May 20, 2014

(54) METHOD TO FABRICATE SMALL DIMENSION DEVICES FOR MAGNETIC RECORDING APPLICATIONS

(75) Inventors: Hui-Chuan Wang, Pleasanton, CA (US); Tong Zhao, Fremont, CA (US); Min Zheng, Milpitas, CA (US); Minghui Yu, Fremont, CA (US); Min Li, Dublin, CA (US); Cherng Chyi Han, San Jose, CA (US)

(73) Assignee: Headway Technologies, Inc., Milpitas, CA (US)

( * ) Notice: Subject to any disclaimer, the term of this patent is extended or adjusted under 35 U.S.C. 154(b) by 623 days.

(21) Appl. No.: 12/658,662

(22) Filed: Feb. 12, 2010

(65) Prior Publication Data
US 2011/0198314 A1    Aug. 18, 2011

(51) Int. Cl.
*B44C 1/22* (2006.01)
*B82Y 25/00* (2011.01)
*G11B 5/31* (2006.01)
*G01R 33/09* (2006.01)
*H01F 41/30* (2006.01)

(52) U.S. Cl.
CPC ............ *B82Y 25/00* (2013.01); *G11B 5/3163* (2013.01); *G01R 33/098* (2013.01); *H01F 41/308* (2013.01)
USPC .............. 216/22; 216/58; 216/67; 204/192.1; 204/192.3; 204/192.32; 204/192.34; 29/603.01

(58) Field of Classification Search
CPC .... B82Y 25/00; G11B 5/3163; G01R 33/098; H01F 41/308
USPC ................. 216/22, 58, 67; 204/192.1, 192.3, 204/192.32, 192.34; 29/603.01
See application file for complete search history.

(56) References Cited

U.S. PATENT DOCUMENTS

| | | | | |
|---|---|---|---|---|
| 4,259,145 A | * | 3/1981 | Harper et al. | 438/712 |
| 4,450,031 A | * | 5/1984 | Ono et al. | 156/345.39 |
| 5,036,252 A | * | 7/1991 | Lob | 315/111.31 |
| 7,438,982 B2 | | 10/2008 | Suwa et al. | |
| 7,560,038 B2 | * | 7/2009 | Fang et al. | 216/22 |
| 7,561,384 B2 | | 7/2009 | Osugi et al. | |
| 7,615,292 B2 | | 11/2009 | Ito et al. | |
| 7,616,404 B2 | | 11/2009 | Suwa et al. | |
| 2007/0092639 A1 | * | 4/2007 | Fuji et al. | 427/130 |
| 2007/0253117 A1 | * | 11/2007 | Takei et al. | 360/313 |
| 2008/0078739 A1 | | 4/2008 | Hibi et al. | |
| 2009/0084757 A1 | * | 4/2009 | Erokhin et al. | 216/66 |

* cited by examiner

Primary Examiner — Shamim Ahmed
(74) Attorney, Agent, or Firm — Saile Ackerman LLC; Stephen B. Ackerman

(57) ABSTRACT

A three step ion beam etch (IBE) sequence involving low energy (<300 eV) is disclosed for trimming a sensor critical dimension (free layer width=FLW) to less than 50 nm. A first IBE step has a steep incident angle with respect to the sensor sidewall and accounts for 60% to 90% of the FLW reduction. The second IBE step has a shallow incident angle and a sweeping motion to remove residue from the first IBE step and further trim the sidewall. The third IBE step has a steep incident angle to remove damaged sidewall portions from the second step and accounts for 10% to 40% of the FLW reduction. As a result, FLW approaching 30 nm is realized while maintaining high MR ratio of over 60% and low RA of 1.2 ohm-$\mu m^2$. Sidewall angle is manipulated by changing one or more ion beam incident angles.

20 Claims, 4 Drawing Sheets

METHOD TO FABRICATE SMALL DIMENSION DEVICES FOR MAGNETIC RECORDING APPLICATIONS

FIELD OF THE INVENTION

The invention relates to a method of trimming the critical dimension (CD) of a magnetoresistive sensor, and in particular, to a multi-step ion beam etch (IBE) process for trimming the sidewall of a giant magnetoresistive (GMR) element or a tunneling magnetoresistive (TMR) element while maintaining a high magnetoresistive ratio (dR/R) and other magnetic properties.

BACKGROUND OF THE INVENTION

A magnetic tunnel junction (MTJ) element also referred to as a sensor is a key component of magnetic recording devices. There is a continuous push to increase recording density which requires the sensor to become smaller in order to meet high performance demands of new devices. There are several ways to generate sensors with a smaller CD. One is to reduce the CD by shrinking the mask dimension in the pattern that is printed into a photoresist mask layer. Subsequently, the mask pattern is transferred through a MTJ stack of layers with an etch process to produce a plurality of MTJ elements with a CD similar to that in the photoresist pattern. Secondly, once the MTJ element is defined by the pattern transfer process, a reactive ion etch (RIE) may be used to trim the sidewalls and thereby shrink the dimension of the sensor. However, both of these methods have practical limits and cannot reproducibly generate a CD less than about 50 nm which is needed in high performance recording devices.

A MTJ element may be based on a TMR effect wherein a stack of layers has a configuration in which two ferromagnetic layers are separated by a thin non-magnetic dielectric layer. In a GMR sensor, the non-magnetic spacer is typically Cu or another non-magnetic metallic layer. In a sensor, the MTJ element is formed between two shields. A MTJ stack of layers that is subsequently patterned to produce a MTJ element may be formed in a so-called bottom spin valve configuration by sequentially depositing a seed layer, an anti-ferromagnetic (AFM) pinning layer, a ferromagnetic "pinned" layer, a thin tunnel barrier layer, a ferromagnetic "free" layer, and a capping layer on a substrate. The AFM layer holds the magnetic moment of the pinned layer in a fixed direction. The free layer has a magnetization that is able to rotate and thereby establish two different magnetic states. Alternatively, the MTJ element may have a top spin valve configuration wherein a free layer is formed on a seed layer followed by sequentially forming a tunnel barrier layer, a pinned layer, AFM layer, and a capping layer, for example.

A routine search of the prior art revealed the following references. U.S. Pat. Nos. 7,438,982, 7,616,404, 7,615,292, and U.S. Patent Application 2008/0078739 all relate to the use of IBE at certain incident angles to modify a surface of a magnetic recording medium but do not teach about shaping sensor sidewalls.

U.S. Pat. No. 7,561,384 discloses a method of patterning a sensor by employing two IBE steps where the second step involves an incident angle greater than the incident angle used in the first step. The second IBE step removes redeposited material from the first IBE step. However, this reference does not address any detrimental effect the second IBE step has on the magnetic properties of sensor layers.

None of the prior art methods provide a solution for achieving a high performance sensor CD less than 50 nm in a reliable manner by trimming a sidewall of a MTJ element. Therefore, a new method is required in order to enable further advances in magnetic recording devices.

SUMMARY OF THE INVENTION

One objective of the present invention is to provide a method for shrinking sensor CD, and in particular, reducing free layer width (FLW) to substantially less than 50 nm.

A second objective of the present invention is to provide a method for shrinking FLW to less than 50 nm according to the first objective while maintaining a high magnetoresistive ratio and other magnetic properties of the sensor.

A third objective of the present invention is to provide a method for shrinking a sensor CD that also enables the junction slope to be easily manipulated.

According to a preferred embodiment, these objectives are achieved by initially depositing a MTJ stack of layers on a substrate such as a first shield in a read head.

The MTJ stack of layers may have a bottom spin valve, top spin valve, or dual spin valve configuration with a capping layer as the uppermost layer in the stack. A photoresist layer is coated on the capping layer and patterned with a conventional process to form a plurality of MTJ shapes in the form of islands having a circular or oval shape, for example, from a top view. The pattern in the photoresist mask layer is then transferred through the MTJ stack preferably by a reactive ion etch (RIE) process to generate a MTJ element having a sidewall and a first width along a plane that will become the air bearing surface (ABS) in the final recording device.

A key feature of the present invention is a multiple step IBE process that trims the sidewall and first width to a substantially smaller width while maintaining MR ratio and other magnetic properties in the MTJ stack. In one embodiment, the MTJ stack has a TMR configuration wherein a non-magnetic spacer made of a dielectric material is formed between a pinned layer and a free layer. Alternatively, the MTJ stack may have a GMR configuration with a non-magnetic metal layer formed between the free layer and pinned layer.

The first step in the multiple step IBE process sequence comprises a low incident angle IBE condition of less than 20 degrees with respect to a plane perpendicular to the planes of the MTJ stack of layers. The inert gas ions comprised of Ar or the like have a low energy (<300 eV) and trim the free layer width (FLW) to a second width that represents removal of about 60% to 90% of the total MTJ width to be trimmed during the entire IBE process sequence. Thereafter, a second IBE step is performed with low energy (<300 eV) and a high incident angle of greater than 60 degrees from the perpendicular plane in a sweeping motion. The ion beam is moved back and forth a plurality of times over the sidewalls of the MTJ element to further trim FLW to a third width and clean up redeposited material remaining from the first IBE step. Next, a third IBE step comprising a low energy (<300 eV) and low incident angle of less than 20 degrees from the perpendicular plane is employed to trim FLW to a final width that represents removal of about 10% to 40% of the total MTJ width to be trimmed in the entire IBE etch sequence. A critical function of the third IBE step is to remove damaged portions of the sidewall that were created during the second IBE step. The component of the ion beam directed perpendicular to the MTJ sidewalls is sufficiently weak that damage to the MTJ layers is not significant. As a result, up to about 20 nm may be trimmed during the multiple IBE steps to shrink the FLW (first width) from around 50 nm to a final width of about 30 nm, for example.

Thereafter, conventional processing is employed to form an insulation layer adjacent to the sidewalls of the MTJ. A hard bias layer for providing longitudinal bias to the free layer in the MTJ is typically formed proximate to the MTJ element. Leads are formed that make electrical contact with the top surface of the MTJ and a second shield is deposited above the MTJ stack.

DETAILED DESCRIPTION OF THE INVENTION

Figure 1:
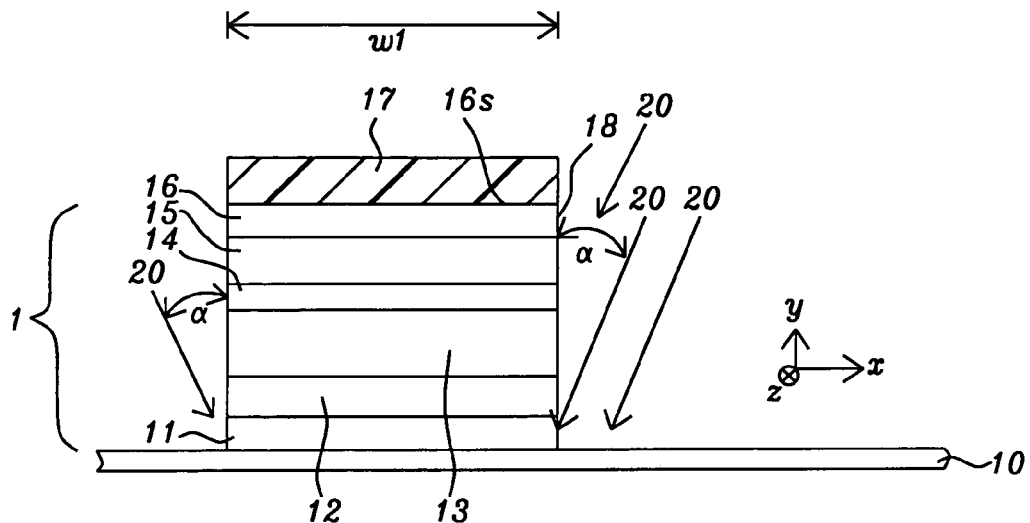
FIG. 1 is a cross-sectional view of a MTJ element during a first IBE etch step according to the present invention in which ions are directed at a steep angle with respect to sidewalls of a MTJ element to trim an initial critical dimension (FLW) to a smaller width.

The present invention is a method of trimming the sidewall and a free layer width (FLW) in a MTJ element (magnetoresistive sensor) such that a FLW of substantially less than 50 nm is achieved while maintaining the magnetic properties of the sensor. Although a bottom spin valve structure is depicted in the exemplary embodiment, the present invention also encompasses top spin valve and dual spin valve configurations. Note that a sidewall of a MTJ element is used in a singular context as it is understood to be a continuous boundary around a patterned MTJ. Only one MTJ element is shown in the drawings although those skilled in the art will appreciate that a plurality of MTJ elements arranged in rows and columns are formed in a typical device pattern.

Referring to FIG. 1, a portion of a partially formed magnetoresistive sensor 1 of the present invention is shown from the plane of an air bearing surface (ABS). There is a substrate 10 that in one embodiment is a bottom lead otherwise known as a bottom shield (S1) which may be a NiFe layer about 2 microns thick that is formed by a conventional method on a substructure (not shown). It should be understood that the substructure may be comprised of a wafer made of AlTiC, for example. Substrate 10 may also be a composite (not shown) having a bottom S1 shield and an upper gap layer wherein a top surface of the gap layer contacts seed layer 11.

A MTJ stack of layers is formed on the substrate 10 and in the exemplary embodiment has a bottom spin valve configuration wherein a seed layer 11, AFM layer 12, pinned layer 13, non-magnetic spacer 14, free layer 15, and capping layer 16 are sequentially formed on the substrate. The seed layer 11 may be comprised of Ta/Ru, Ta, Ta/NiCr, Ta/Cu, Ta/Cr or other materials typically employed to promote a smooth and uniform grain structure in overlying layers. Above the seed layer 11 is an AFM layer 12 used to pin the magnetization direction of the overlying pinned layer 13, and in particular, the outer portion or AP2 layer (not shown). The AFM layer 12 may have a thickness from 40 to 300 Angstroms and is preferably comprised of IrMn. Optionally, one of PtMn, NiMn, OsMn, RuMn, RhMn, PdMn, RuRhMn, or MnPtPd may be employed as the AFM layer.

The pinned layer 13 preferably has a synthetic anti-parallel (SyAP) configuration represented by AP2/Ru/AP1 where a coupling layer made of Ru, Rh, or Ir, for example, is sandwiched between an AP2 layer and an AP1 layer (not shown). The AP2 layer which is also referred to as the outer pinned layer is formed on the AFM layer 12 and may be made of CoFe with a thickness of about 10 to 50 Angstroms. The magnetic moment of the AP2 layer is pinned in a direction anti-parallel to the magnetic moment of the AP1 layer. For example, the AP2 layer may have a magnetic moment oriented along the "+x" direction while the AP1 layer has a magnetic moment in the "−x" direction. A slight difference in thickness between the AP2 and AP1 layers produces a small net magnetic moment for the pinned layer 13 along the easy axis direction of the TMR sensor to be patterned in a later step. The AP1 layer may be comprised of CoFe, CoFeB, or a combination thereof.

Above the pinned layer 13 is a non-magnetic spacer. In one embodiment, the non-magnetic spacer 14 may be comprised of Cu or another metal to give a sensor 1 with a GMR configuration. In another aspect, a GMR sensor may have a current confining path (CCP) configuration in which a dielectric material such as a metal oxide is sandwiched between two metal layers and has metal pathways therein to restrict the current flowing between a first metal layer and second metal layer in a direction perpendicular to the planes of the metal layers. Alternatively, the non-magnetic spacer 14 may be comprised of a dielectric material such as MgO, TiOx, AlTiO, MgZnO, $Al_2O_3$, ZnO, ZrOx, or HfOx which results in a TMR configuration. In a TMR embodiment, a MgO layer is preferably formed by depositing a first Mg layer on the pinned layer 13 and then oxidizing the Mg layer with a natural oxidation (NOX) or ROX process. Thereafter, a second Mg layer is deposited on the oxidized first Mg layer. Following a subsequent annealing step, the non-magnetic spacer essentially becomes a uniform MgO tunnel barrier layer as oxygen from the oxidized Mg layer diffuses into the second Mg layer.

The free layer 15 formed on the non-magnetic spacer 14 may be made of CoFe, CoFeB, NiFe, or a combination thereof. Optionally, other ferromagnetic materials may be selected as a single component free layer or in a composite with one or more of CoFe, CoFeB, and NiFe. The width of the free layer 15 along the ABS to be formed in a subsequent lapping step is a critical dimension that controls the performance of the sensor. In general, a smaller FLW and track width will enable a higher recording density in the sensor device. Track width is understood to mean the distance between the leads (not shown) along the top surface of the capping layer 16. In an embodiment wherein the sidewall 18 is essentially vertical with respect to substrate 10, track width is considered to be equal to FLW. On the other hand, the sidewall may be sloped such that the width of the top surface of capping layer 16 is less than the width of the seed layer 11 at the ABS in which case track width is less than FLW.

The capping layer 16 is employed as the uppermost layer in the MTJ stack and may be comprised of Ta, Ru/Ta, or Ru/Ta/Ru, for example. All layers in the MTJ stack may be deposited in a DC sputtering chamber of a sputtering system such as an Anelva C-7100 sputter deposition system which includes ultra high vacuum DC magnetron sputter chambers with multiple targets and at least one oxidation chamber. Typically, the sputter deposition process involves an argon sputter gas and a base pressure between $5 \times 10^{-8}$ and $5 \times 10^{-9}$ torr. A lower pressure enables more uniform films to be deposited.

The present invention also anticipates that the capping layer 16 may include one or more hard mask materials that have specific etch rates during IBE, RIE, and CMP processes to optimize the MTJ stack profile and improve resistance to erosion.

Once all of the layers 11-16 in the MTJ stack are laid down, the MTJ stack may be annealed by heating to a temperature between about 250° C. to 350° C. for a period of 2 to 10 hours while a magnetic field is applied along a certain direction to set the magnetic direction for the pinned layer and free layer. For example, if the easy axis direction is intended to be along the x-axis direction, a magnetic field may be applied along the x-axis during the annealing step.

As a first step in the MTJ patterning process, a photoresist layer 17 is coated on the top surface of the capping layer 16 and patterned to form a plurality of shapes such as islands in the form of circles or ovals from a top view (not shown). The width of a photoresist shape from a top view following the patterning step is referred to as the photo CD and is usually measured by a CD-scanning electron microscope (SEM). The pattern is then transferred through the MTJ stack of layers with an etch process that is preferably a reactive ion etch (RIE). As a result, sidewall 18 is formed at the edge of the MTJ stack of layers 11-16. In a preferred embodiment, the sidewall is essentially vertical (perpendicular to the substrate 10) and the photo CD in the photoresist layer is replicated in the MTJ stack of layers. However, the present invention also anticipates that the sidewall 18 may have a slope wherein the width of the capping layer 16 is less than the width of the seed layer 11 along the x-axis direction.

Figure 5:
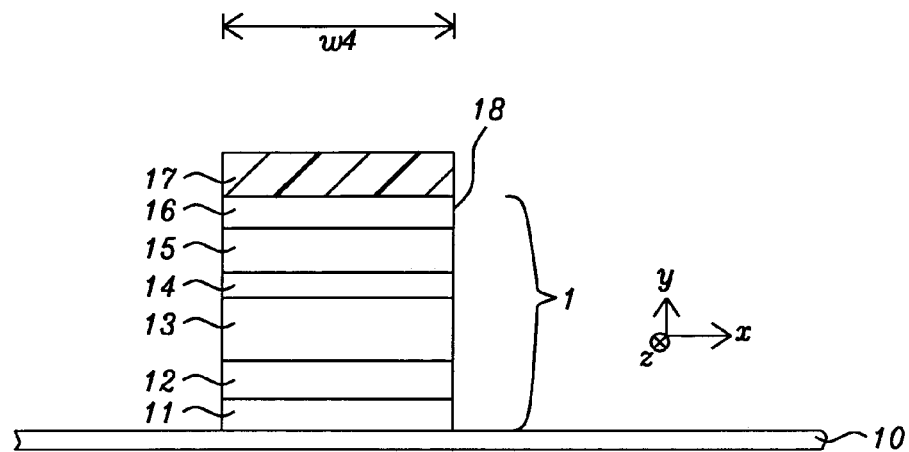
FIG. 5 is a cross-sectional view of a MTJ element having a substantially reduced FLW following an IBE etch sequence of three steps according to an embodiment of the present invention.

A key feature of the present invention is a multiple step IBE sequence that is employed to trim the initial FLW shown as w1 to a substantially smaller value depicted as w4 (FIG. 5). It should be understood that track width (TW) may be less than FLW because TW is measured at the top surface of the MTJ stack that has a CD≤FLW.

The IBE sequence is performed in such a manner that the magnetic properties including Hc and RA in the partially formed magnetoresistive sensor in FIG. 1 are substantially maintained in the trimmed sensor stack (FIG. 5) while the MR ratio is significantly enhanced compared with a conventional single IBE trim method or a two step trim sequence involving different IBE incident angles.

According to the multiple IBE sequence of the present invention, all three IBE steps are preferably performed in the same chamber of an IBE tool to optimize throughput. A first IBE step (FIG. 1) is performed with an ion beam 20 having a low energy of <300 eV that is directed at sidewall 18 at an incident angle α of greater than 0 degrees but less than 20 degrees with respect to a plane that is vertical to the substrate 10. In other words, ion beam 20 has a primary component that is perpendicular with respect to the substrate and to MTJ element top surface 16s. The steep angle IBE etch is employed to remove 60% to 90% of the total FLW (critical dimension) to be trimmed during the entire IBE sequence. Therefore, a majority of the trimmed width represented by (w1-w4) is removed during the first IBE step. In one aspect where sidewall 18 is vertical, the trimming occurs at an essentially equal rate independent of the location on sidewall 18. However, when sidewall 18 is sloped at an angle that is not vertical, trimming may selectively occur along a wider section of the MTJ element to produce a more vertical sidewall. Preferably, the ion beam 20 is generated from an inert gas such as Ar, Ne, or Xe with conditions comprising a flow rate of 10 to 50 standard cubic centimeters per minute (sccm) flow rate, an ion current between 100 and 600 mA, and a RF power from about 100 to 600 Watts. As a result, a considerable amount of residue tends to be redeposited on the sidewall 18.

Figure 2:
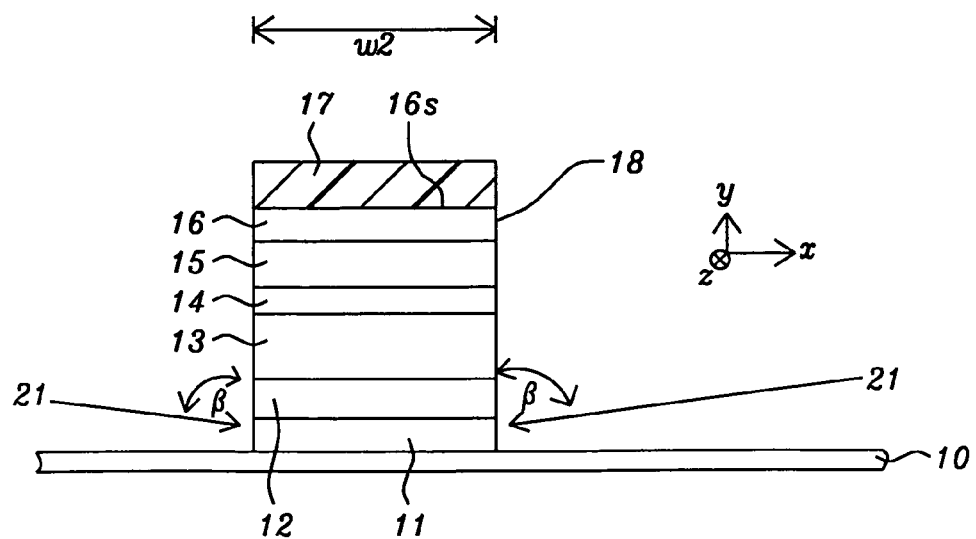
FIG. 2 is cross-sectional view of the trimmed MTJ element after the first IBE step and during a second IBE step at low energy and with low incident angle with respect to the MTJ sidewalls that removes residue from the first IBE step and further trims the CD of the MTJ element.

Referring to FIG. 2, the FLW is w2 following the first IBE step where w2<w1. A second IBE step is performed with an incident beam 21 that is generated with an inert gas and a low energy of less than about 300 eV. It is important that the incident beam 21 impinge on sidewall 18 at an angle β of between 60 and 90 degrees with respect to a plane that is perpendicular to substrate 10 and to MTJ element top surface 16s. Ion beam 21 is said to have a primary component that is parallel with respect to the substrate. A second critical factor is the ion beam 21 is directed at the sidewall 18 with a sweeping motion to remove the residue from the first IBE step and to further trim the FLW to a width w3. The high incident angle is necessary for efficient side trimming of sensor 1.

Figure 3:
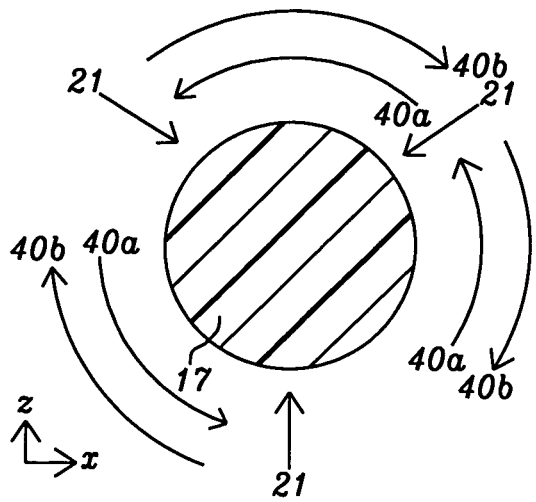
FIG. 3 is a top view showing the sweeping motion around the MTJ element during the second IBE step that removes residue from the first IBE etch step.

Referring to FIG. 3, a top-down view of the partially formed magnetoresistive sensor is shown to illustrate the sweeping motion of the ion beam 21 during the second IBE step. In the exemplary embodiment, the photoresist mask layer 17 (and underlying sensor) has a circular shape. The second IBE step comprises rotating the ion beam 21 in a counterclockwise direction 40a for up to about 40 degrees and then reversing the movement in a clockwise direction 40b over the same arc of up to about 40 degrees. Optionally, the first movement from a starting position may be a clockwise rotation 40b followed by a counterclockwise motion 40a back to the starting position. The sweeping motion that includes movement 40a followed by movement 40b, or vice versa, is repeated a plurality of times (cycles) at a sweep rate of 5 to 10 cycles per minute. We have discovered that between 3 and 10 sweep cycles are necessary for efficient residue removal from sidewall 18.

Figure 4:
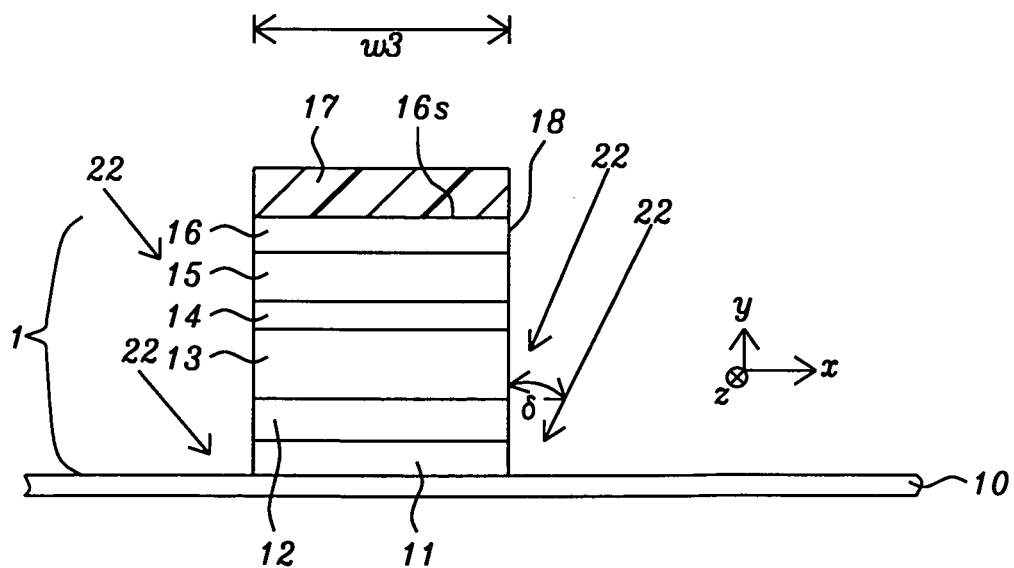
FIG. 4 is a cross-sectional view of the trimmed MTJ element after the second IBE step and during a third IBE step at low energy and with high incident angle with respect to the MTJ sidewalls that further trims the MTJ element to a final FLW.

Referring to FIG. 4, the partially formed magnetoresistive sensor having a FLW=w3 is then treated with a third IBE step that comprises a low energy less than 300 eV and a low incident angle δ greater than 0 degrees but less than 20 degrees with respect to a plane formed perpendicular to substrate 10. Thus, ion beams 22 are directed toward sidewall 18 at a steep angle and remove about 10% to 40% of the width (w1-w4) to be trimmed during the entire multiple step IBE sequence. Ion beam 22 has a primary component that is perpendicular with respect to substrate 10 and MTJ top surface 16s. The third IBE step serves an important function in that damaged portions of sidewall 18 resulting from the second IBE step are removed without causing further damage that could degrade magnetic properties of the magnetoresistive sensor 1. In particular, the third IBE step removes damaged portions of non-magnetic spacer 13 that were exposed to ion beam 21 in the previous step thereby preserving a high MR ratio in both TMR and GMR embodiments. Those skilled in the art will appreciate that the x-axis component of ion beam 22 in the third IBE step is sufficiently weak so as not to induce any significant damage to sidewall 18. Moreover, the y-axis (vertical) component of the third IBE step is primarily responsible for removing damaged portions of sidewall 18 from the previous step.

Referring to FIG. 5, the magnetoresistive sensor has a final FLW of w4 after the multiple step IBE sequence is completed. The advantage of the IBE trim sequence as described herein is that a FLW=w4 can be reproducibly formed with a value substantially less than 50 nm and in certain cases approaching 30 nm. In the prior art, FLW values of significantly less than 50 nm cannot be reproducibly generated in a manufacturing environment. Thus, we have discovered a method that enables sensor technology to move into critical dimensions approaching 30 nm that will lead to a dramatic improvement in device performance. Furthermore, the slope of sidewall 18 may be manipulated to an angle that ranges from 90 degrees with respect to substrate 10 to an angle less than 90 degrees where the width of capping layer 16 is less than the width of seed layer 11 along the ABS. In certain sensor designs, the sidewall slope is less than 90 degrees to avoid a tendency for MTJ stacks with a high aspect ratio (height/width) to collapse during ion milling. The slope of sidewall 18 may be modified by changing the incident angle of one or more of the three IBE steps during the IBE trim sequence. In particular, the second IBE step may be optimized to generate an angle that is more vertical for sidewall 18 with respect to substrate 10.

Figure 6:
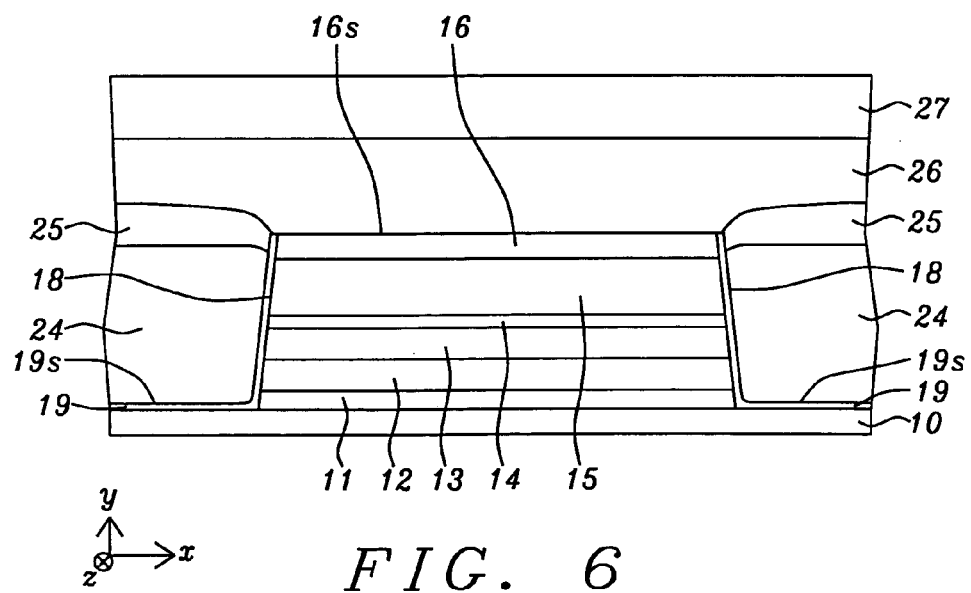
FIG. 6 is a cross-sectional view of a read head where a sensor trimmed by a multiple step IBE sequence of the present invention is formed between two hard bias layers.

Referring to FIG. 6, fabrication of a read head that includes magnetoresistive sensor 1 may follow a conventional pathway. According to one embodiment, a seed layer 19 having a top surface 19s may be deposited on substrate 10 and adjacent to sidewall 18. Thereafter, a hard bias layer 24 with sufficient thickness for providing longitudinal biasing to free layer 15 is formed on seed layer 19. Electrical leads 25 are formed on hard bias layer 20. Once the photoresist mask 17 is removed by a lift-off process, for example, a second gap layer 26 and second shield (S2) 27 may be sequentially formed on the top surface 16s of capping layer 16. In this embodiment, sidewall 18 is shown with a slope unequal to 90 degrees. In an alternative embodiment (not shown), sidewall 18 may have a vertical slope with respect to substrate 10 in order to enable a maximum density in the MTJ array formed on the substrate. It should be understood that the present invention encompasses other hard bias configurations and is not limited to the embodiment depicted in FIG. 6.

EXAMPLE 1

In order to demonstrate the benefits of the multiple step IBE sequence of the present invention, a TMR sensor was fabricated according to a method previously practiced by the inventors, and according to an embodiment as described herein. For each of the wafers 1, 2, and 3, a bottom spin valve configuration was formed on a AlTiC substrate and is represented by Ru/Ta/IrMn/CoFe/Ru/CoFeB/MgO/CoFeB/Ru/Ta where Ru/Ta is the seed layer, IrMn is the AFM layer, CoFe/Ru/CoFeB is the pinned layer, MgO is a tunnel barrier layer, CoFeB is the free layer, and Ru/Ta is a composite capping layer. Data was collected for circular shaped devices as described below.

Figure 7:
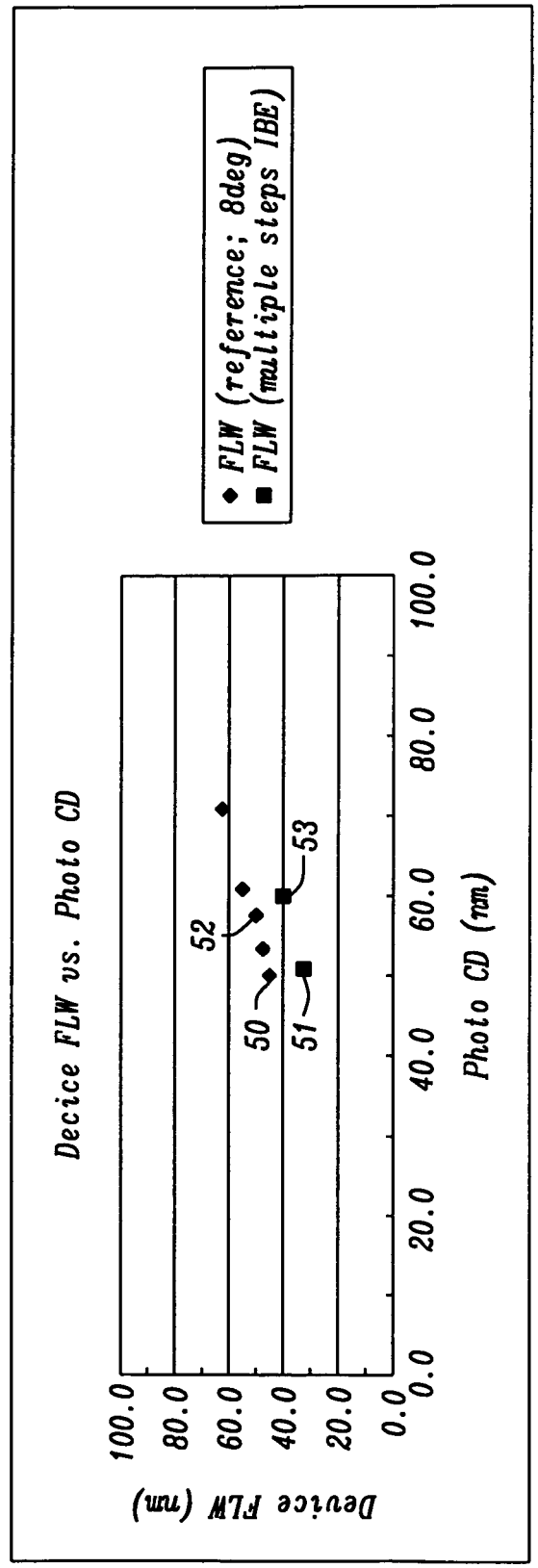
FIG. 7 is a graph that depicts the relationship between the CD of the initially formed Photo CD in a photoresist mask and the free layer width (FLW) in the MTJ following transfer of the photoresist CD through a MTJ stack of layers and trimming the CD with a three step IBE sequence according to a method of the present invention.

Wafer 3 is a reference sample that is a sensor made by a prior art method in which the FLW formed after pattern transfer through the sensor stack of layers is trimmed with a single IBE step comprising an incident angle of 8 degrees with respect to a plane formed perpendicular to the substrate. As shown in Table 1, the sensor on wafer 3 is capable of achieving a RA=1.2 ohm-µm$^2$ and a dR/R=62%. Referring to FIG. 7, CD measurements obtained from wafer 3 are represented by the diamond shapes. The data indicates, for example, when FLW=52 nm (point 50) after the initial pattern formation (Photo CD), the minimum trimmed FLW value achieved is about 43 nm for a reduction of 9 nm when a single IBE trim step is employed. Similarly, a 61 nm CD after pattern transfer is reduced to about 52 nm (point 52) following a single IBE step. Photo CD measurements were obtained using a CD-SEM and FLW measurements are taken from transmission electron microscopy (TEM) cross-sections.

TABLE 1

Effect of IBE conditions on magnetic properties of NiCr/IrMn/CoFe/Ru/CoFeB/MgO/CoFeB/Ru/Ta/Ru TMR sensors

| Wafer | IBE Condition | RA | dR/R | Normalized dR/R |
|---|---|---|---|---|
| 1 | 8 deg. angle, 100% trim + 70 deg. sweep | 1.2 | 48% | 0.77 |
| 2 | 8 deg. angle, 80% trim + 70 degree sweep + 8 degree angle, 20% trim | 1.2 | 61% | 0.98 |
| 3 | 8 deg. angle, 100% trim | 1.2 | 62% | 1.0 |

Wafer 1 is a modification of Wafer 3 in that a first IBE step involving an incident ion beam angle of 8 degrees with respect to vertical is employed to trim the FLW to the desired width. In addition, a second IBE step with a 70 degree sweeping motion is used to remove residue from the first IBE step. Note that Wafer 3 does not represent an acceptable manufacturing process because residue remains after a single IBE trim step. Since no third IBE step is included for Wafer 1, some damage occurs to the exposed portions of the sensor sidewalls and especially to the MgO tunnel barrier which causes an undesirable decrease in dR/R to 48% even though RA is maintained at 1.2 ohm-µm$^2$.

Wafer 2 is produced according to an IBE sequence of the present invention wherein step 1 comprises an incident beam angle of 8 degrees with respect to a vertical plane to shrink the FLW to by about 80% of the desired amount. In the following step 2, an ion beam at a 70 degree incident angle is applied in a sweeping motion to remove residue from step 1. Finally, step 3 comprises another 8 degree incident angle IBE at a low energy of <300 eV to shrink FLW by the final 20% of the desired amount. In so doing, the FLW can be decreased by about 20 nm from a Photo CD of 53 nm to final CD of 35 nm (Point 51) or from a Photo CD of 62 nm to a final CD of 40 nm (Point 53). In other words, a critical dimension reduction of about 20 nm from an initial Photo CD in the range of 50 nm to 70 nm can be achieved by following a three step IBE process of the present invention. RA is maintained at 1.2 ohm-µm$^2$ while dR/R=61% is essentially equivalent to the value of 62% achieved after a single IBE trim step. Thus, the three step IBE sequence of the present invention offers an advantage in realizing a smaller sensor CD than previously realized without degrading any other magnetic properties including RA and dR/R. It should be understood that a similar CD reduction of around 20 nm can also be achieved when starting with a Photo CD greater than 70 nm. However, the present invention is most advantageous in an embodiment wherein the Photo CD is less than 70 nm so that FLW dimensions of less than 50 nm may be fabricated with higher yields and better reliability for advanced devices.

The three step IBE sequence as disclosed herein may be readily implemented in existing manufacturing lines since no new tools or materials are required. Furthermore, the process can be applied to sensor devices of older technology products where there is evidence of damage from a two step IBE process thereby improving magnetic properties of CIP-GMR, CPP-GMR, and TMR sensors where CIP refers to current-in-plane and CPP means current perpendicular to plane.

While this invention has been particularly shown and described with reference to, the preferred embodiment thereof, it will be understood by those skilled in the art that various changes in form and details may be made without departing from the spirit and scope of this invention.

We claim:

1. A method of reducing a critical dimension in a magnetoresistive sensor, comprising:
   (a) providing a magnetic tunnel junction (MTJ) stack of layers on a substrate including a pinned layer, a free layer, a non-magnetic spacer between the pinned layer and free layer, and an uppermost capping layer;
   (b) patterning the MTJ stack of layers to form a MTJ element having a top surface and an essential vertical sidewall along all of the layers in the MTJ element that connects the top surface with the substrate, said free layer has a critical dimension which is a first width along a plane that is parallel to the MTJ element top surface, and the pinned layer, and non-magnetic spacer have the same sidewall as that along the free layer;
   (c) performing a first low energy ion beam etch (IBE) step with an ion beam incident angle less than about 20° with respect to a plane perpendicular to the substrate to trim the sidewall such that the free layer has a second width less than the first width;
   (d) performing a second low energy IBE step with a sweeping motion and with an ion beam incident angle greater than about 60° with respect to a plane perpendicular to the substrate to remove residue formed during the first IBE step and further trim the sidewall such that the free layer has a third width less than the second width; and
   (e) performing a third low energy IBE step with an ion beam incident angle less than about 20° with respect to a plane perpendicular to the substrate to remove damaged portions of the sidewall resulting from the second IBE step and to further trim the sidewall such that the free layer has a final width less than the third width, the sidewall has a slope of about 90 degrees or less with respect to the substrate, and the first, second, and third low energy IBE steps are performed in consecutive order after the sidewall is formed along the pinned layer and non-magnetic spacer.

2. The method of claim 1 wherein the low energy IBE steps comprise an inert gas and an energy less than about 300 eV.

3. The method of claim 2 wherein the IBE steps comprise an ion current between about 100 and 600 mA and a RF power from about 100 to 600 Watts.

4. The method of claim 1 wherein the sweeping motion comprises a first movement of rotating the substrate within an arc of about 40 degrees in a clockwise or counterclockwise direction from a starting position followed by a second movement of rotating the substrate in the opposite direction back to the starting position, said first and second movements are repeated a plurality of times.

5. The method of claim 1 wherein the first IBE step is responsible for about 60% to 90% of a critical dimension reduction represented by subtracting a value for the final width from a value for the first width.

6. The method of claim 1 wherein the third IBE step is responsible for about 10% to 40% of a critical dimension reduction that is determined by subtracting a value for the final width from a value for the first width.

7. The method of claim 1 wherein the first width is from about 50 to 70 nm and the final width is about 20 nm less than the first width.

8. The method of claim 1 wherein the MTJ element is a CIP-GMR, CPP-GMR, or a TMR sensor.

9. The method of claim 1 wherein the sidewall has an angle with respect to the substrate that may be changed by varying the incident angle during one or more of the three IBE etch steps.

10. The method of claim 9 wherein the MTJ element has a track width essentially equal to the final width when the sidewall angle is about 90 degrees.

11. A method of reducing a critical dimension in a magnetoresistive sensor, comprising:
    (a) providing a magnetic tunnel junction (MTJ) stack of layers on a substrate including a seed layer, AFM layer, pinned layer, free layer, non-magnetic spacer between the pinned layer and free layer, and an uppermost capping layer;
    (b) patterning the MTJ stack of layers to form a MTJ element having a top surface and an essentially vertical sidewall formed along all of the layers in the MTJ element that connects the top surface with the substrate, said free layer has a critical dimension which is a first width along a plane that is parallel to the MTJ element top surface, and the pinned layer, seed layer, AFM layer, and non-magnetic spacer have the same sidewall as that formed along the free layer;
    (c) performing a first low energy ion beam etch (IBE) step with an ion beam incident angle that has a primary component which is perpendicular with respect to the substrate to trim the sidewall such that the free layer has a second width less than the first width;
    (d) performing a second low energy IBE step with a sweeping motion and with an ion beam incident angle that has a primary component which is parallel with respect to the substrate to remove residue formed during the first IBE step and further trim the sidewall such that the free layer has a third width less than the second width; and
    (e) performing a third low energy IBE step with an ion beam incident angle that has a primary component which is perpendicular with respect to the substrate to remove damaged portions of the sidewall resulting from the second IBE step and to further trim the sidewall such that the free layer has a final width less than the third width, the sidewall has an angle of about 90 degrees or less with respect to the substrate, and the first, second, and third low energy IBE steps are performed in consecutive order after the sidewall is formed along all the layers in the MTJ stack.

12. The method of claim 11 wherein the low energy IBE steps comprise an inert gas and an energy less than about 300 eV.

13. The method of claim 12 wherein the IBE steps comprise an ion current between about 100 and 600 mA and a RF power from about 100 to 600 Watts.

14. The method of claim 11 wherein the sweeping motion comprises a first movement of rotating the substrate within an arc of about 40 degrees in a clockwise or counterclockwise direction from a starting position followed by a second movement of rotating the substrate in the opposite direction back to the starting position, said first and second movements are repeated a plurality of times.

15. The method of claim 11 wherein the first IBE step comprises an incident angle of greater than 0 degrees and less than 20 degrees with respect to a plane perpendicular to the substrate, and is responsible for about 60% to 90% of a critical dimension reduction that is determined by subtracting a value for the final width from a value for the first width.

16. The method of claim 11 wherein the second IBE step comprises an incident angle of greater than about 60 degrees and less than 90 degrees with respect to a plane formed perpendicular to the substrate.

17. The method of claim 15 wherein the third IBE step comprises an incident angle greater than 0 degrees and less than 20 degrees with respect to a plane perpendicular to the substrate, and is responsible for about 10% to 40% of the critical dimension reduction.

18. The method of claim 15 wherein the first width is from about 50 to 70 nm and the critical dimension reduction is about 20 nm.

19. The method of claim 11 wherein the MTJ element is a CIP-GMR, CPP-GMR, or a TMR sensor.

20. The method of claim 11 wherein the sidewall has an angle with respect to the substrate that may be changed by varying the incident angle during one or more of the three IBE etch steps.

* * * * *